US008243464B2

(12) United States Patent
Lin (10) Patent No.: US 8,243,464 B2
(45) Date of Patent: Aug. 14, 2012

(54) PRINTED CIRCUIT BOARD STRUCTURE

(75) Inventor: Hsien-Chieh Lin, Taoyuan (TW)

(73) Assignee: Nan Ya PCB Corp., Taoyuan County (TW)

(*) Notice: Subject to any disclaimer, the term of this patent is extended or adjusted under 35 U.S.C. 154(b) by 348 days.

(21) Appl. No.: 12/646,904

(22) Filed: Dec. 23, 2009

(65) Prior Publication Data
US 2011/0100695 A1    May 5, 2011

(30) Foreign Application Priority Data
Nov. 3, 2009 (TW) .............................. 98137187 A (51) Int. Cl.
*H05K 7/12* (2006.01)
*H05K 7/00* (2006.01)
*H05K 1/11* (2006.01)
(52) U.S. Cl. ........ 361/767; 361/777; 361/779; 174/261; 174/262
(58) Field of Classification Search .......... 174/261–266; 361/767, 748, 777, 779; 29/829, 842
See application file for complete search history.

(56) References Cited

U.S. PATENT DOCUMENTS

| 4,952,272 | A  | * | 8/1990 | Okino et al. ................. 216/11 |
| 5,933,752 | A  | * | 8/1999 | Yanagida ..................... 438/613 |
| 6,426,281 | B1 | * | 7/2002 | Lin et al. ..................... 438/612 |
| 6,908,311 | B2 | * | 6/2005 | Ono et al. .................... 439/65 |
| 7,213,329 | B2 |   | 5/2007 | Kim et al. |
| 2006/0035453 | A1 | * | 2/2006 | Kim et al. ................... 438/613 |
| 2008/0023833 | A1 | * | 1/2008 | Daubenspeck et al. ....... 257/737 |

* cited by examiner

*Primary Examiner* — Timothy Thompson
*Assistant Examiner* — Sherman Ng (57) ABSTRACT

Disclosed is a printed circuit board structure which is manufactured by providing a core board, forming an inner circuit layer on the core board surface, forming a bonding pad on the inner circuit, forming a ring-shaped anti-etching layer on the bonding pad, forming an anti-soldering insulation layer on the ring-shaped anti-etching layer and the bonding pad, and forming an opening to expose a part of the bonding pad, wherein the radius of the opening is shorter than the radius of the ring-shaped anti-etching layer, and the bonding pad surface is free of concave. The described structure may prevent the solder extending along the bottom void of the anti-soldering insulation layer to other regions.

7 Claims, 16 Drawing Sheets

PRINTED CIRCUIT BOARD STRUCTURE

CROSS REFERENCE TO RELATED APPLICATIONS

This application claims priority of Taiwan Patent Application No. 098137187, filed on Nov. 3, 2009, the entirety of which is incorporated by reference herein.

BACKGROUND OF THE INVENTION

1. Field of the Invention

The present invention relates to PCBs, and in particular relates to the formation of a bonding pad and a ring-shaped anti-etching layer of a PCB.

2. Description of the Related Art

A printed circuit board (PCB) is formed as follows. An electrical layout connecting elements of the PCB is drawn by circuit design, and electrical conductors corresponding to the layout are reproduced on an insulator by mechanical/chemical processes, surface treatments, and the likes. In the other word, the PCB is the substrate collocating the electrical elements, wherein the circuit formed by the electrical elements serves to deal the signals. The design quality of the PCB not only influences the electrical product confidence but also determines the product performance and competition. A circuit pattern is formed by processes such as printing, lithography, etching, plating, and the likes. Accurate lines are formed by the processes, to support electrical elements and connections therebetween. PCB technological trends strive for higher densities and multi-layered circuitry.

Figure 1A:
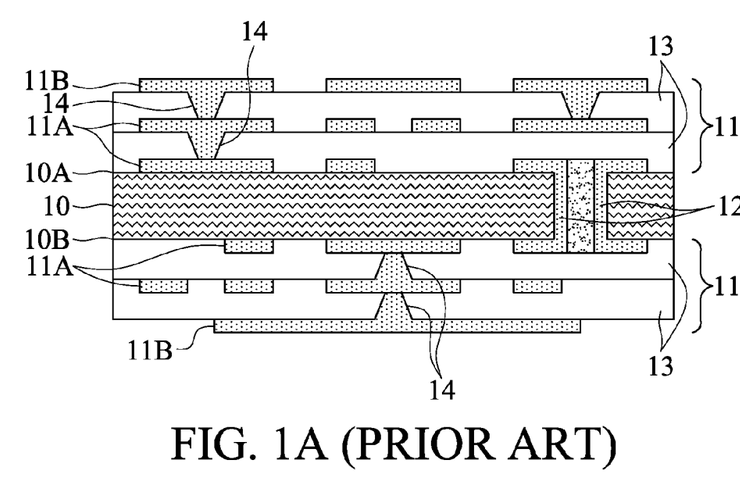
FIGS. 1A-1D are serial cross sections showing the process for forming a conventional printed circuit board structure.
Figure 1B:
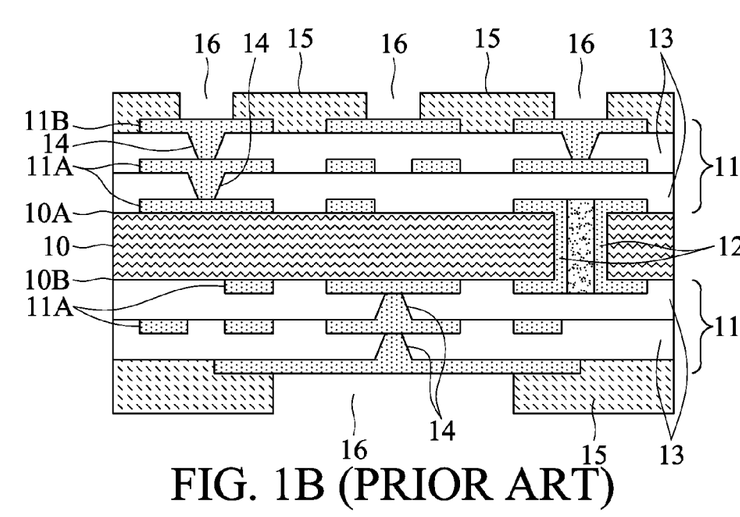
Figure 1C:
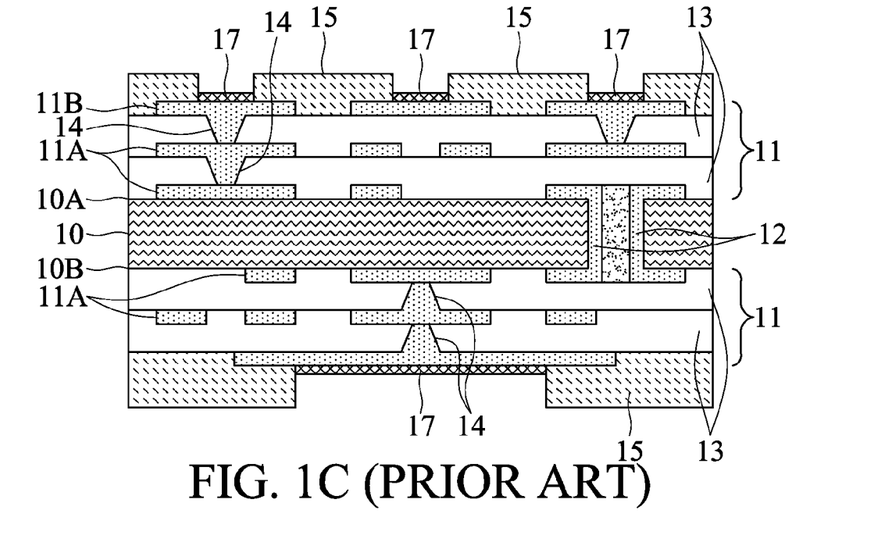
Figure 1D:
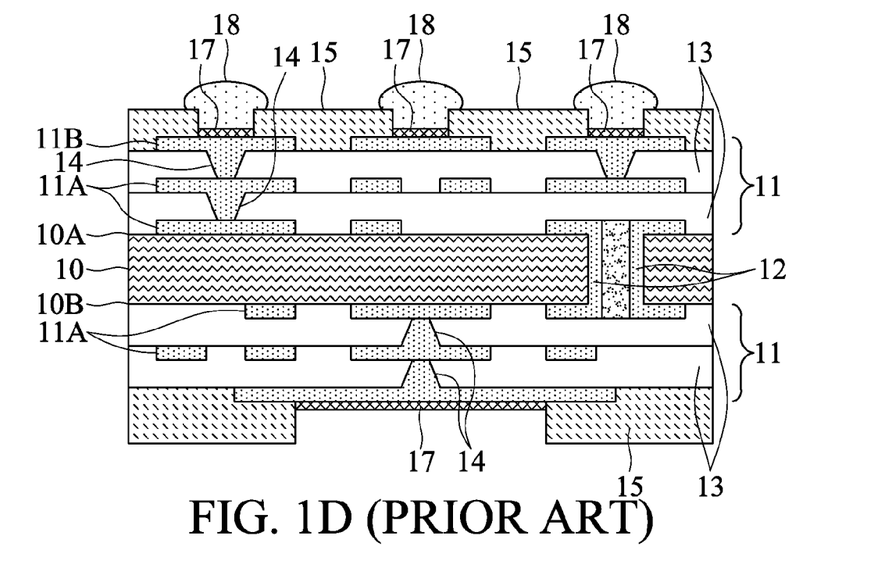

For multi-layered designs, the outer most metal patterned layer (usually a copper layer) of the component and solder side of a PCB, serves as a bonding pad to connect other electrical elements through the solder ball to the PCB, as shown in FIGS. 1A-1D. As shown in FIG. 1A, the core board 10 has a conductive through hole 12 to connect the laminar circuits 11 on the component side 10A and the solder side 10B. For a laminar circuit 11, the inner circuits 11A and the outer bonding pad 11B separated by the insulation layer 13 are connected by a blind via hole 14. As shown in FIG. 1B, a green paint 15 is formed to cover the bonding pad 11B, and an opening 16 is formed to expose a part of the bonding pad 11B. As shown in FIG. 1C, the metal protection layer 17 is formed on the exposed bonding pad 11B by a surface treatment process. As shown in FIG. 1D, the solder ball 18 is placed in the opening 16, and then solder is reflowed to form the solder bump.

Figure 1E:
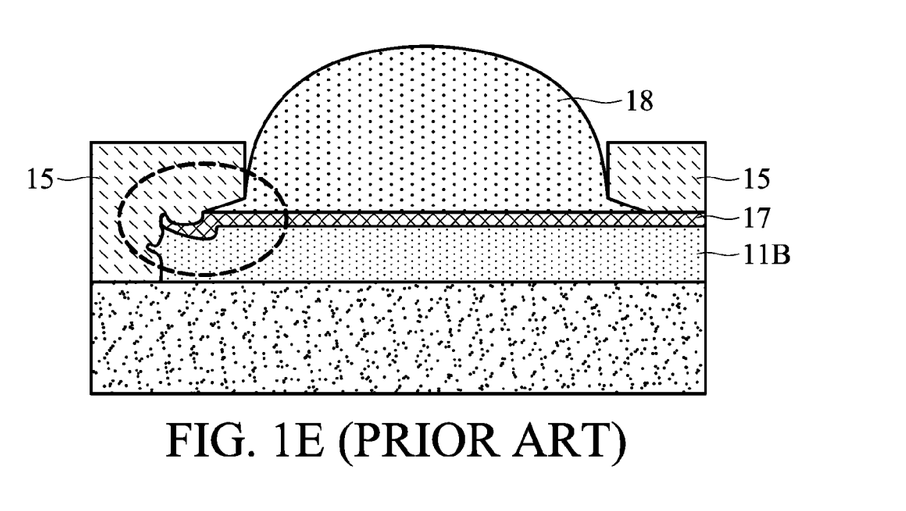
FIGS. 1E-1F are cross sectional views of a conventional printed circuit board structure.
Figure 1F:
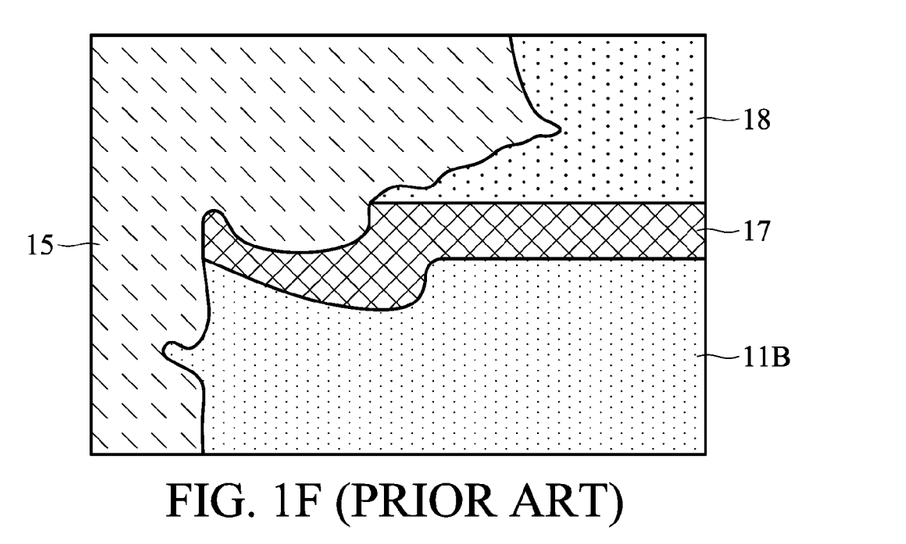

However, devices manufactured by the method shown in FIGS. 1A-1D have some problems. First, the bottom of the green paint 15 adjacent to the opening 16 is easily influenced by etching or surface treatment, thereby being laminated from the bonding pad 11B and forming a void between the green paint 15 and the bonding pad 11B is formed. The void continuously enlarges during placing the solder ball and following solder reflow, such that the solder material will extend along the void to other regions, as shown in FIG. 1E and a local magnification in FIG. 1F. The described phenomenon causes shorts and lowers device confidence.

U.S. Pat. No. 7,213,329 discloses a method for forming a ring-shaped structure. In this patent, the seed layer is a collocated plated copper layer to form a dual-layered electrical connection pad, and the plating copper is etched through to part of the seed layer to form an opening. Thus, the contact area of the tin ball and the pad is increased, increasing sealing confidence. The described etching simultaneously removes part of the green paint, the plating copper layer, and the seed layer. Thereafter, the metal protection layer is formed on the seed layer by a surface treatment process, and the tin ball is placed by printing. However, the seed layer is often over etched, such that the opening is too deep to place the tin ball in it due to high aspect ratio. In addition, because the seed layer under the tin ball is too thin, the seed layer is easily combined with the tin ball to form an alloy layer. As such, the thin seed layer will be thinner, thereby degrading the product confidence.

Accordingly, a novel PCB structure is called desired to solve the described problems.

BRIEF SUMMARY OF THE INVENTION

The invention provides a printed circuit board structure, comprising: a core board; an inner circuit on the surface of the core board; a bonding pad on the inner circuit; a ring-shaped anti-etching layer on the outer-ring of the bonding pad; and an anti-soldering insulation layer on the ring-shaped anti-etching layer and the bonding pad. The anti-soldering insulation layer has an opening to expose a part of the bonding pad, wherein the opening has a shorter radius than the ring-shaped anti-etching layer, and the bonding pad surface is free of concave.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
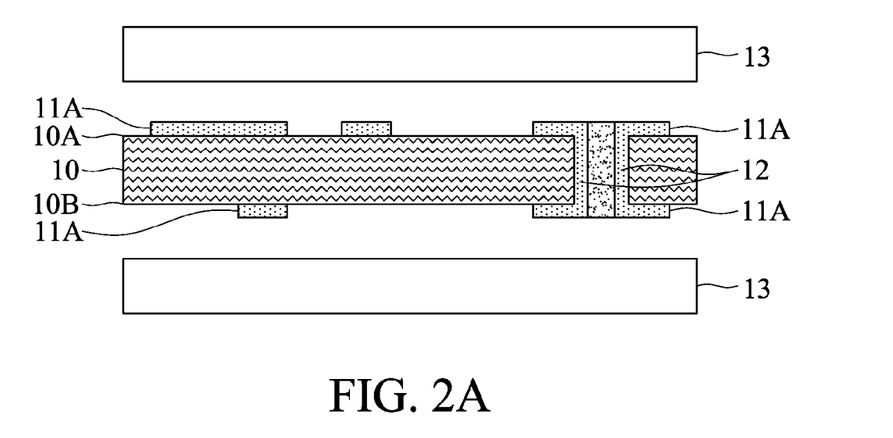
FIGS. 2A-2N are serial cross sections showing the process for forming a printed circuit board structure in one embodiment of the invention.
Figure 2B:
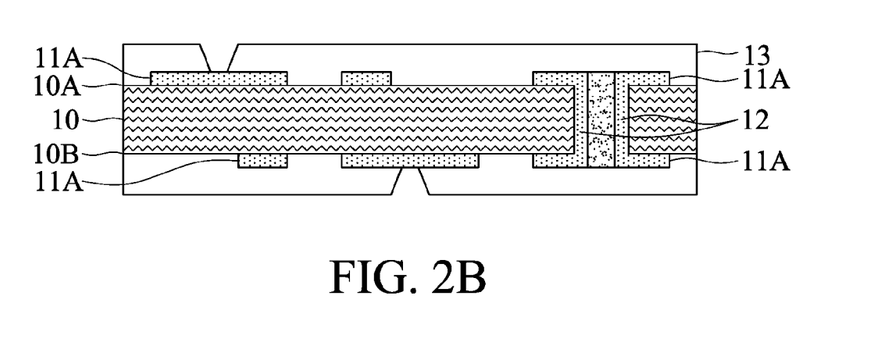
Figure 2C:
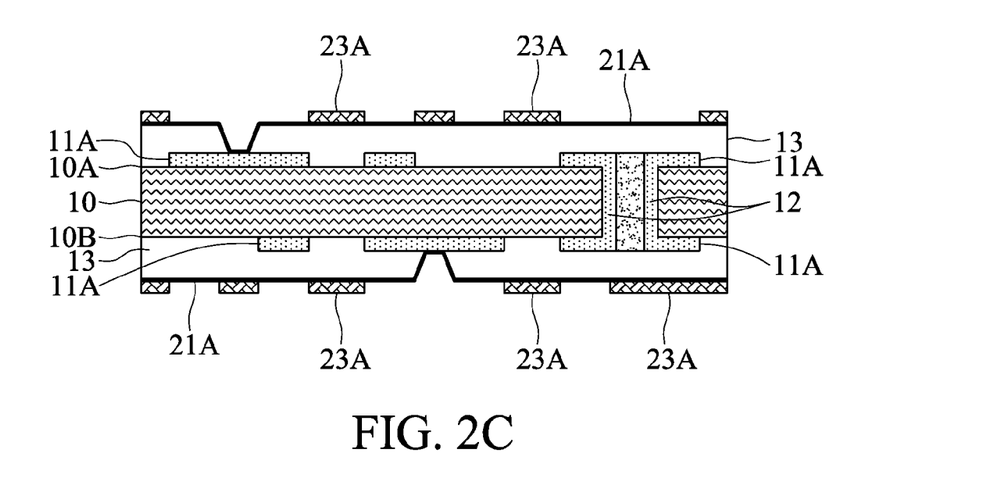
Figure 2D:
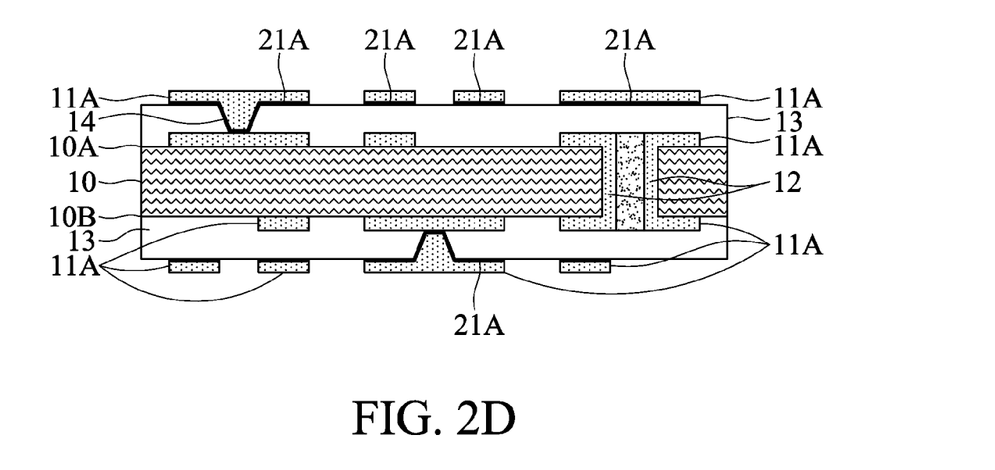
Figure 2E:
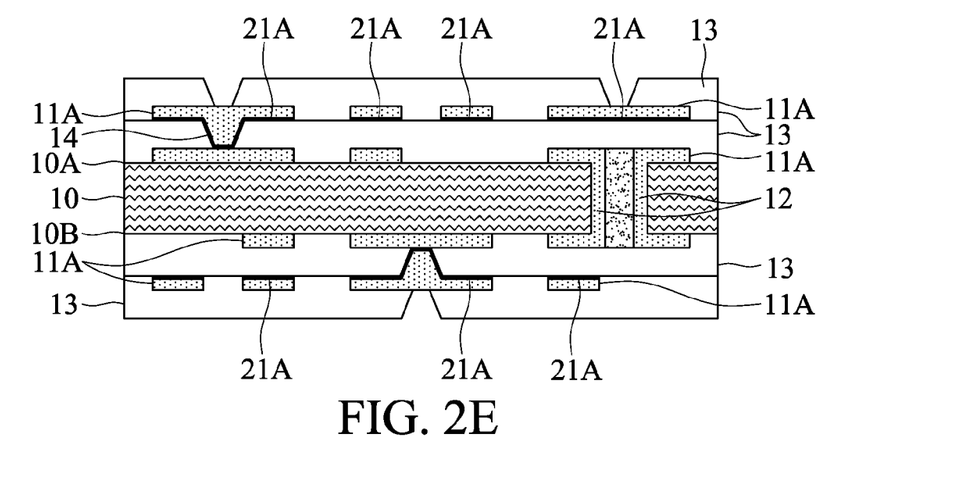
Figure 2F:
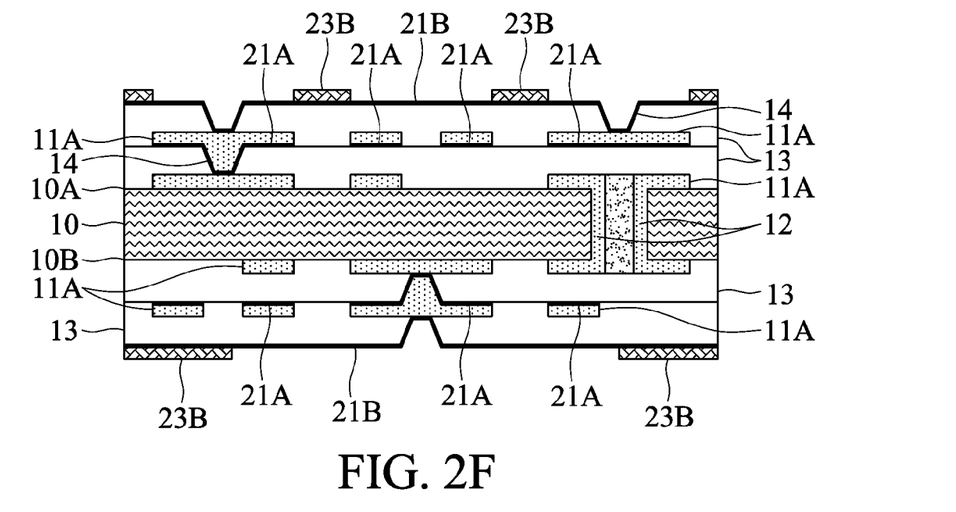
Figure 2G:
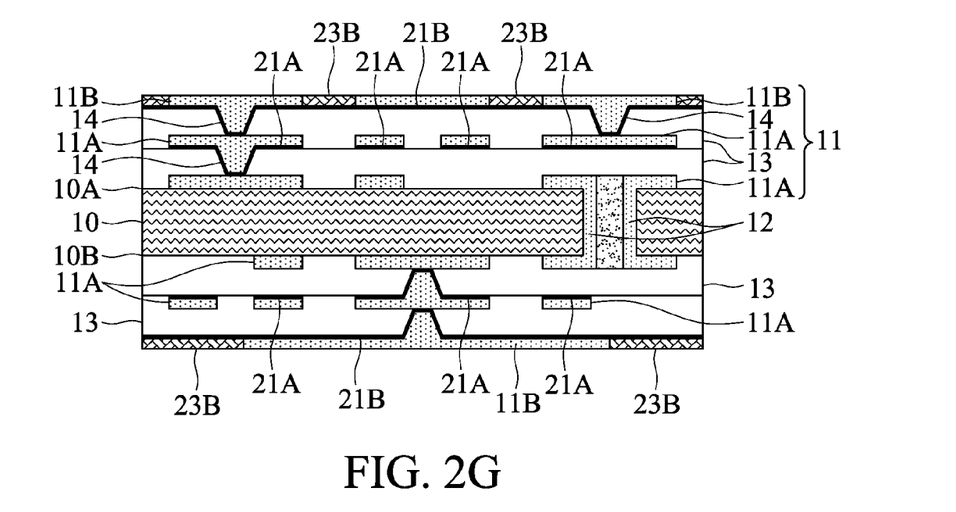
Figure 2H:
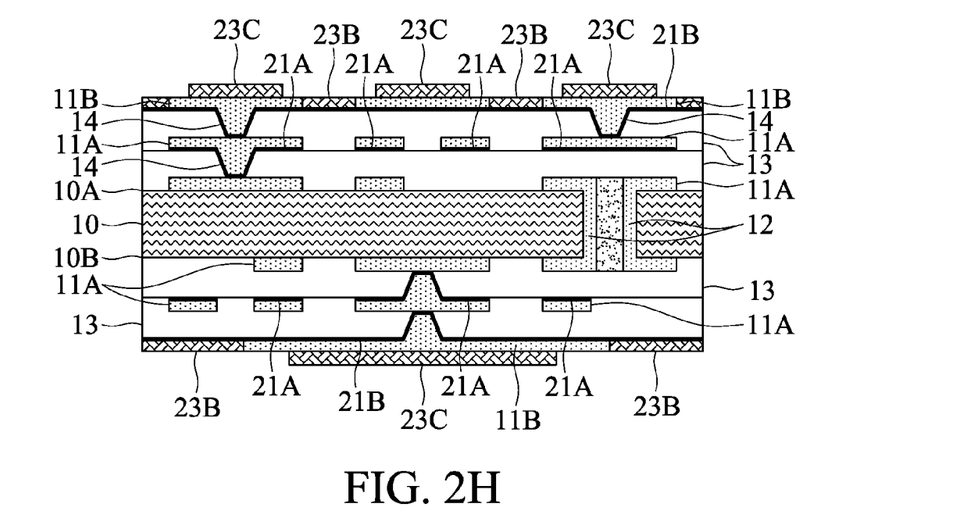
Figure 2I:
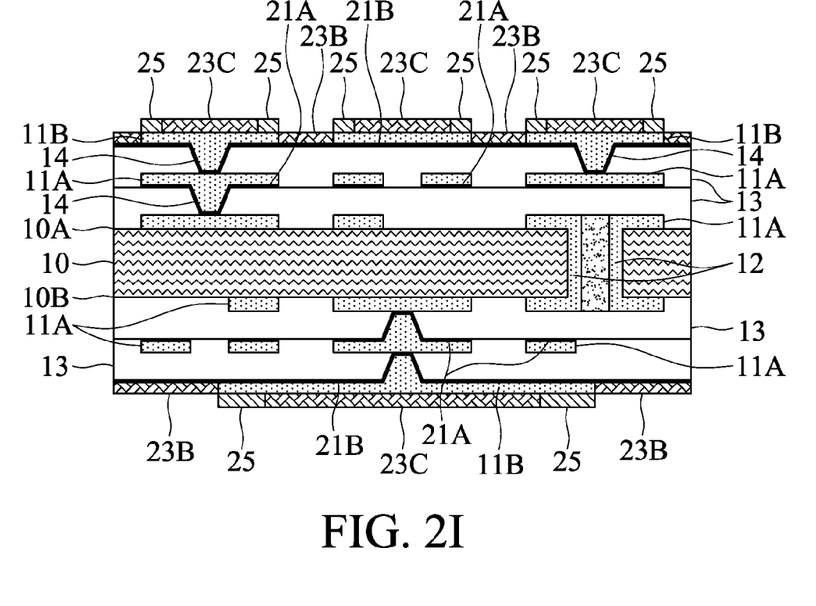
Figure 2J:
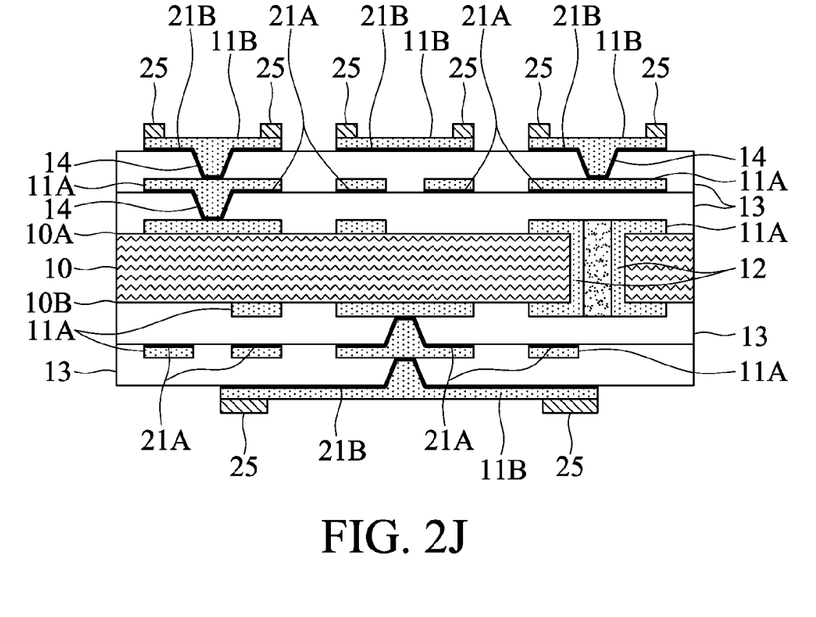
Figure 2K:
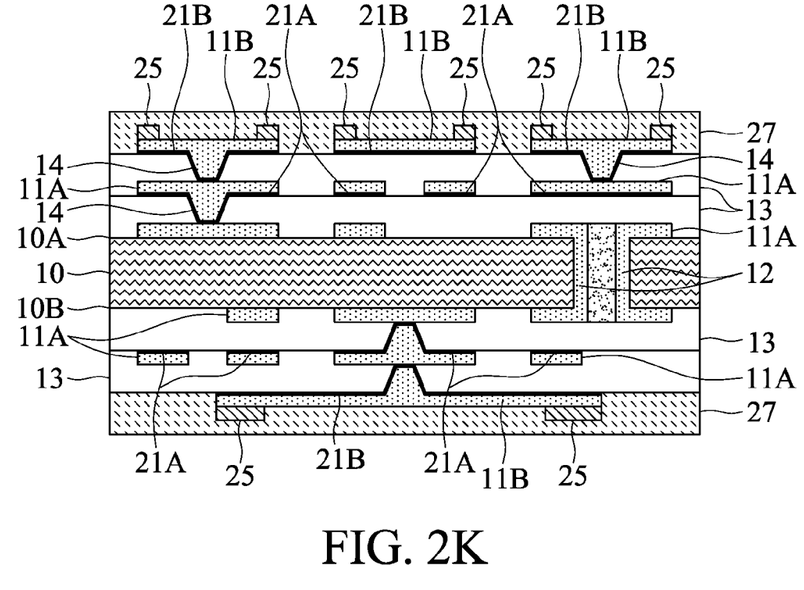
Figure 2L:
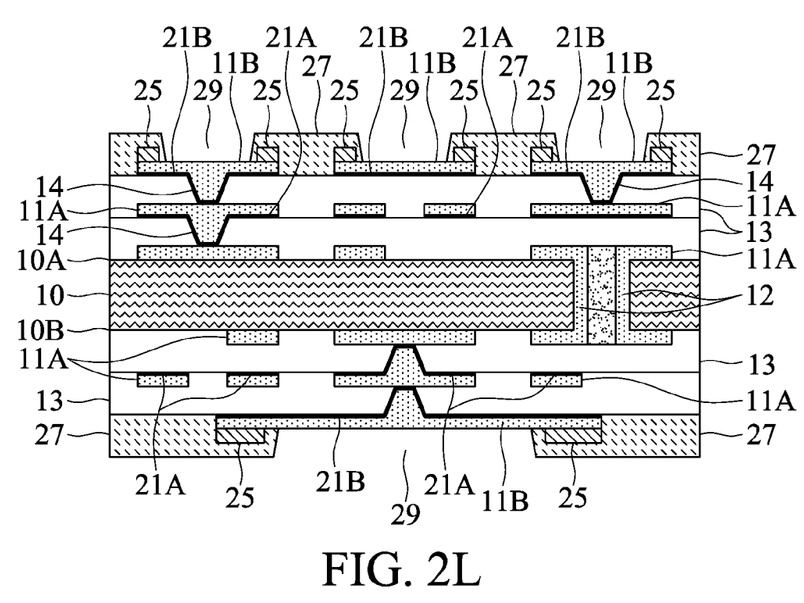
Figure 2M:
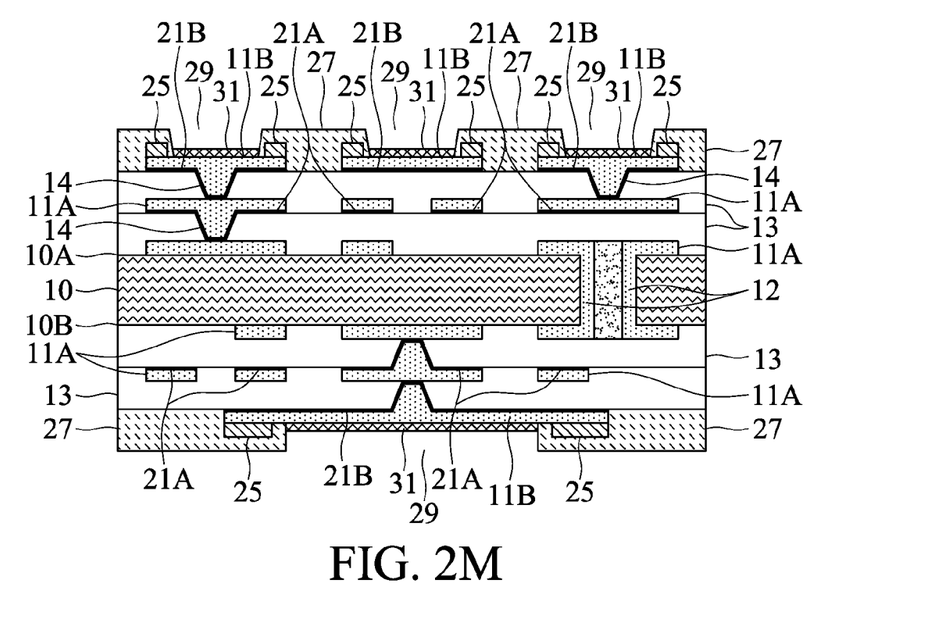
Figure 2N:
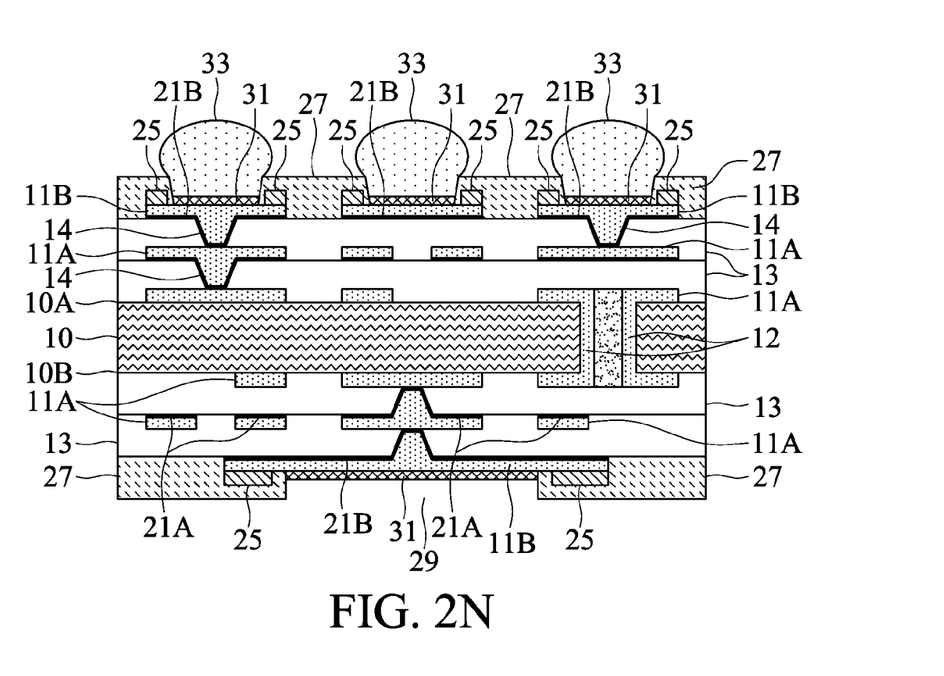

The invention provides a method for forming a printed circuit board structure as shown in FIGS. 2A-2N. First, a core board 10 is provided, with a top surface defined as a component side 10A, and a bottom surface defined as a solder side 10B. The core board 10 can be made of paper phenolic resin, composite epoxy resin, polyimide resin, or glass fiber. Subsequently, inner circuits 11A are formed on both sides of the core board 10, and a conductive through hole 12 is formed to electrically connect the inner circuits 11A of the component side 10A to the solder side 10B. The inner circuit 11A can be formed by a semi additive process (in abbreviate SAP) or a depositing metal layer collocating lithography process. The inner circuit 11A is composed of copper or other conductive material such as aluminum, nickel, gold, or alloys thereof. The conductive through hole 12 can be formed by laser or mechanical drilling. The hole sidewall is plated to form a conductive meal layer, and the hole is filled by a through hole resin. The conductive metal layer plated on the hole sidewall can be made of copper, aluminum, nickel, gold, tin, or alloys thereof. The insulation layer 13 is then formed on the inner circuit 11A. The material of the insulation layer 13 includes epoxy resin, bismaleimide triacine (in abbreviate BT), ajinomoto built-up film, polyphenylene oxide (in abbreviate PPE), or polytetrafluorethylene (in abbreviate PTFE). The insulation layer 13 can be formed by a coating or thermal lamination process.

As shown in FIG. 2B, part of the insulation layer 13 is then removed to expose a part of the inner circuit 11A by laser ablation or lithography collocating etching process.

As shown in FIG. 2C, the seed layer 21A is formed on the described structure, and a patterned photoresist layer 23A is then formed on the seed layer 21A. The seed layer can be formed by physical or chemical vapor deposition, sputtering, or electroless plating. The material of the seed layer includes copper, tin, nickel, aluminum, chromium, titanium, tungsten, or composite alloys thereof. As shown in FIG. 2D, a metal layer is plated on the seed layer that is not covered by the patterned photoresist layer 23A, thereby forming the second-layered inner circuit 11A and the blind via hole 14. The patterned photoresist layer 23A and the seed layer 21A pre-covered by the patterned photoresist layer 23A are removed to obtain the structure shown in FIG. 2D. The described method is a conventional self-additive process (in abbreviate SAP). The second-layered inner circuit 11A and the blind via hole 14 can be formed by other conventional methods and are not limited to the SAP process in FIGS. 2C-2D. For example, first, the metal layer may be blanketly deposited, then, the patterned photoresist layer may be formed, wherein the metal layer not covered by the patterned photoresist layer is then removed, thereby forming the patterned metal layer such as the inner circuit 11A and the blind via hole 14. The material selection of the second-layered inner circuit 11A and the blind via hole 14 may be similar to the inner circuit 11A in FIG. 2A.

As shown in FIG. 2E, the insulation layer 13 is then formed on the structure, shown in FIG. 2D, and a part of the insulation layer 13 is removed to expose a part of the circuit 11A. The material selection, formation, and removal of the insulation layer are similar to the above described and omitted for simplicity.

As shown in FIG. 2F, the seed layer 21B and the patterned photoresist layer 23B are sequentially formed on the insulation layer 13 and the exposed inner circuit 11A. As shown in FIG. 2G, the bonding pad 11B and the blind via hole 14 are formed by a plating process, thus, forming a laminar circuit 11 is obtained, it includes the most outer bonding pad 11B, the inner circuit 11A, and the blind via hole 14 connecting them. The processes in FIGS. 2F to 2G are similar to the SAP in FIGS. 2C-2D, with the difference therebetween being the process in FIG. 2G excluding removal of the patterned photoresist layer 23B and the seed layer 21B.

Figure 3A:
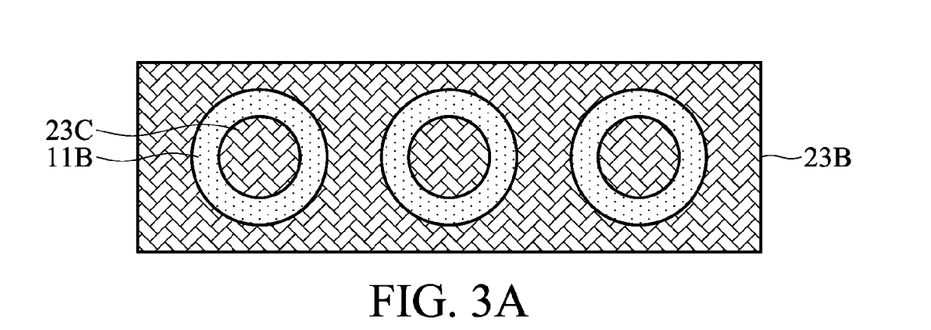
FIGS. 3A-3C are top views corresponding to the process for forming the printed circuit board structure in FIGS. 2H-2J.

As shown in FIG. 2H, the patterned photoresist layer 23C is formed on a part of the bonding pad 11B, thereby exposing the outer ring part of the bonding pad 11B. For further clarify the outer ring part, please refer to FIG. 3A (the top view of the structure in FIG. 2H). In FIG. 3A, the bonding pad 11B is formed between the photoresist layer 23B, and the patterned photoresist layer 23C and the bonding pad 11B are concentric circles. The patterned photoresist layer 23C has a shorter radius than the bonding pad 11B, thereby exposing the outer ring part of the bonding pad 11B.

Figure 3B:
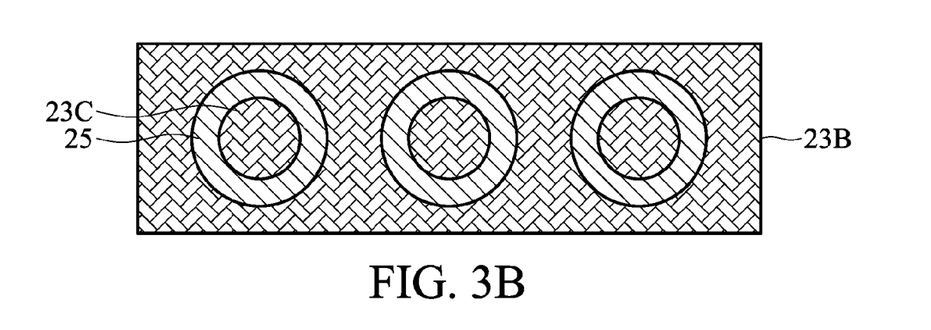
Figure 3C:
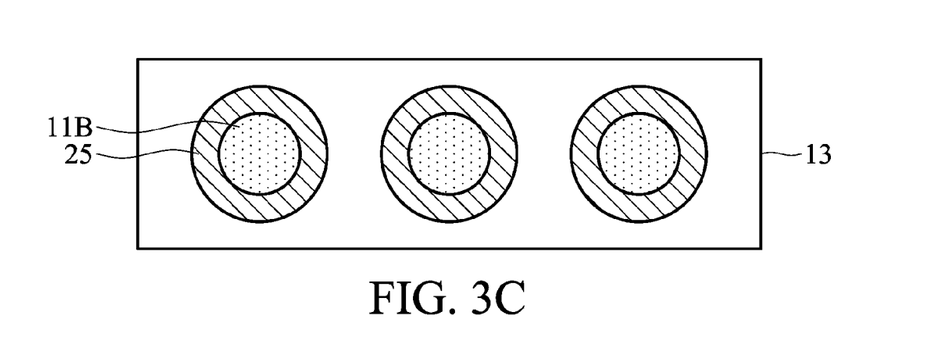

As shown in FIG. 2I, the remaining seed layer 21B is utilized for a subsequent plating process to form the ring-shaped anti-etching layer 25. The top view of the structure in FIG. 2I is shown in FIG. 3B. The ring-shaped anti-etching layer 25 and the bonding pad 11B are preferably composed of similar material, thereby being tightly combined without any void therebetween. As shown in FIG. 2J, the patterned photoresist layers 23B and 23C are removed, and the exposed seed layer 21B is then removed. The top view of the structure in FIG. 2J is shown in FIG. 3C.

Note that after the bonding pad 11B is formed, the ring-shaped anti-etching layer 25 is then formed by a plating process as shown in FIGS. 2H-2J. The invention does not directly form a thick bonding pad and then etch (collocating the lithography) the core region of the thick bonding pad. Although the method may remain the outer-ring part of the thick bonding pad as ring-shaped anti-etching layer, the core region of the bonding pad may often have too high of an aspect ratio and irregular thickness due to the etching process. Thus, making it difficult for the solder material to be deposited on the core region of the bonding pad. Meanwhile, if the core region of the bonding pad is too thin, it may easily combine with the solder material to form an alloy layer and further reduce the thickness of the bonding pad. A bonding pad with insufficient thickness will degrade device confidence. Compared to the described thick bonding pad, the thickness of the bonding pad 11B in the invention is not influenced by the formation of the ring-shaped anti-etching layer 25, and the surface of the bonding pad 11B is free of concave. Accordingly, the bonding pad 11B of the printed circuit board structure of the invention has constant thickness that is not thinned when the anti-etching layer 25 is formed.

As shown in FIG. 2K, the anti-soldering insulation layer 27 such as a green paint is formed by a coating process to cover the described structure. In one embodiment, the anti-soldering insulation layer 27 is thicker than the ring-shaped anti-etching layer 25 to totally cover the ring-shaped anti-etching layer.

As shown in FIG. 2L, part of the anti-soldering insulation layer 27 is removed to form the opening 29 to expose a part of the bonding pad 11B. The removal process includes a laser ablation, a lithography (exposure/development), or a plasma etching process. In one embodiment, the opening 29 has a shorter radius than the ring-shaped anti-etching layer 25.

As shown in FIG. 2M, the metal protection layer 31 is formed in the bottom of the opening 29 by a surface treatment process. The metal protection layer 31 can be made of nickel, gold, tin, tin lead alloy, aluminum, chromium, titanium, tungsten, or copper. The metal protection layer 31 can be formed by a physical vapor deposition (PVD), a chemical vapor deposition (CVD), a plating, a sputtering, or an electroless plating process. In one embodiment, the metal protection layer is thinner than the ring-shaped anti-etching layer 25. The metal protection layer 31 is used to prevent the bonding pad from oxidizing and increase the combination of the solder material and the bonding pad.

As shown in FIG. 2N, the solder ball 33 is formed in the opening 29 to complete the printed circuit board structure of the invention. The material of the solder ball 33 includes tin, tin lead alloy, tin silver copper alloy, tin copper alloy, tin bismuth alloy, tin bismuth nickel alloy, or alloys thereof.

Compared to related art, even if the anti-soldering insulation layer 27 in the ring-shaped anti-etching layer 25 is side etched due to the laser ablation or plasma etching process in FIG. 2L and/or the surface treatment process in FIG. 2M, the ring-shaped anti-etching layer 25 of the invention would still block the void caused from the side etching. Accordingly, in the invention, the solder material of the solder ball 33 will be preserved in the ring-shaped anti-etching layer 25 and does not extend to other bonding pad areas causing shorts.

Figure 4A:
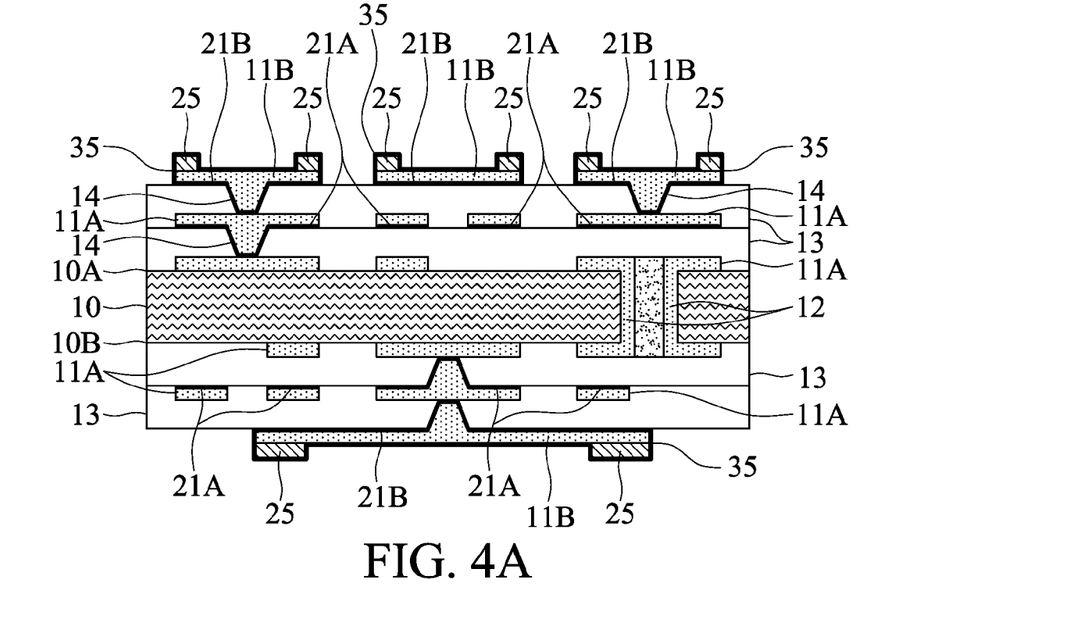
FIGS. 4A-4B are serial cross sections showing the process for forming a printed circuit board structure in one embodiment of the invention.
Figure 4B:
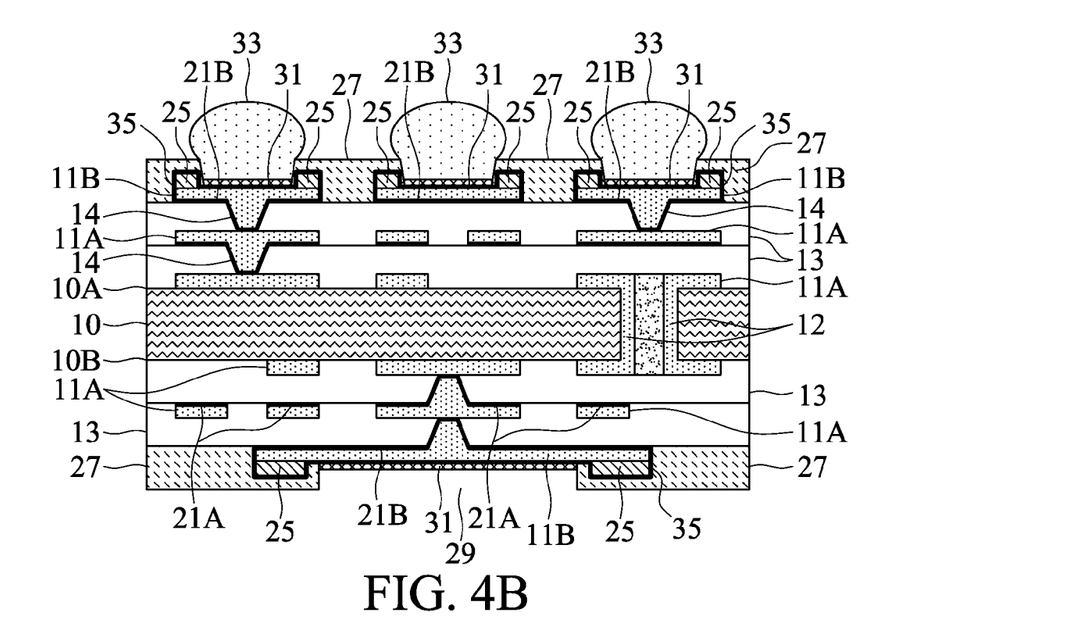

In one embodiment, an anti-etching metal layer 35 is further formed on the top surface and the sidewall of the bonding pad 11B and the ring-shaped anti-etching layer 25 as shown in FIG. 4A. The formation of the anti-etching metal layer 35 follows the removal of the patterned photoresist layer 23B and 23C as shown in FIG. 2J, and before the formation of the anti-soldering layer 27 as shown in FIG. 2K. The formation of the anti-etching metal layer 35 is similar to the surface treatment (ASF) process, and the material thereof can be nickel, tin, palladium, gold, aluminum, tungsten, chromium, and the likes. The anti-etching metal layer is utilized to further enforce the described structure. Because the inter region between the ring-shaped anti-etching layer 25 and the bonding pad 11B still possibly etched during the processes, the anti-etching metal layer 35 is added to avoid the inter region between the thinner ring-shaped anti-etching layer 25 and the bonding pad 11B from etching. After the formation of the anti-etching metal layer 35, the following processes to from the anti-soldering insulation layer 27, the opening 29, the metal protection layer 31, and the solder ball 33 are performed, wherein they are similar to that of FIGS. 2K-2N. The resulting structure is shown as FIG. 4B.

Figure 5A:
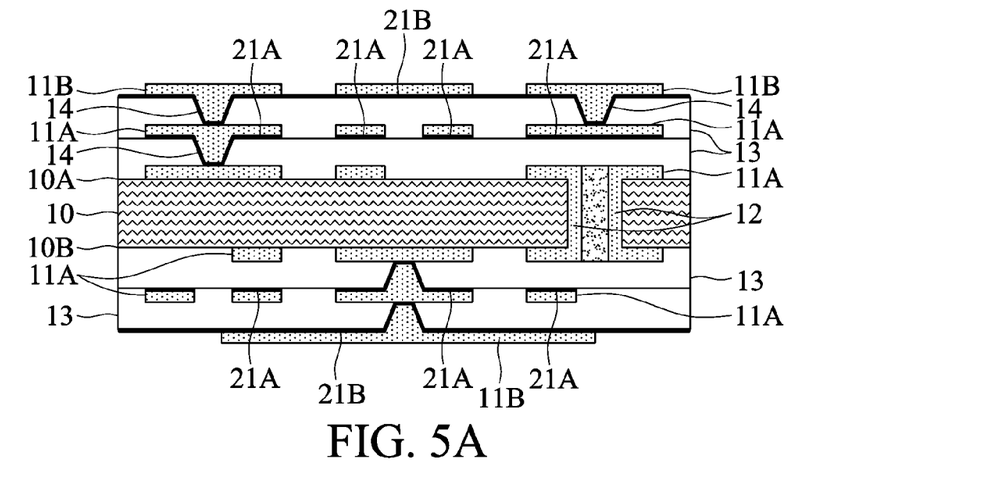
FIGS. 5A-5E are serial cross sections showing the process for forming a printed circuit board structure in one embodiment of the invention.
Figure 5B:
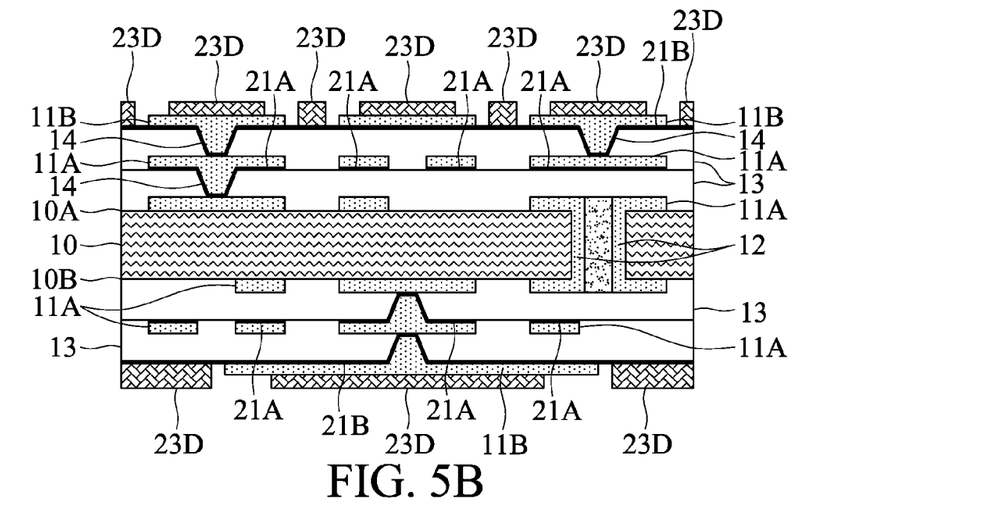
Figure 5C:
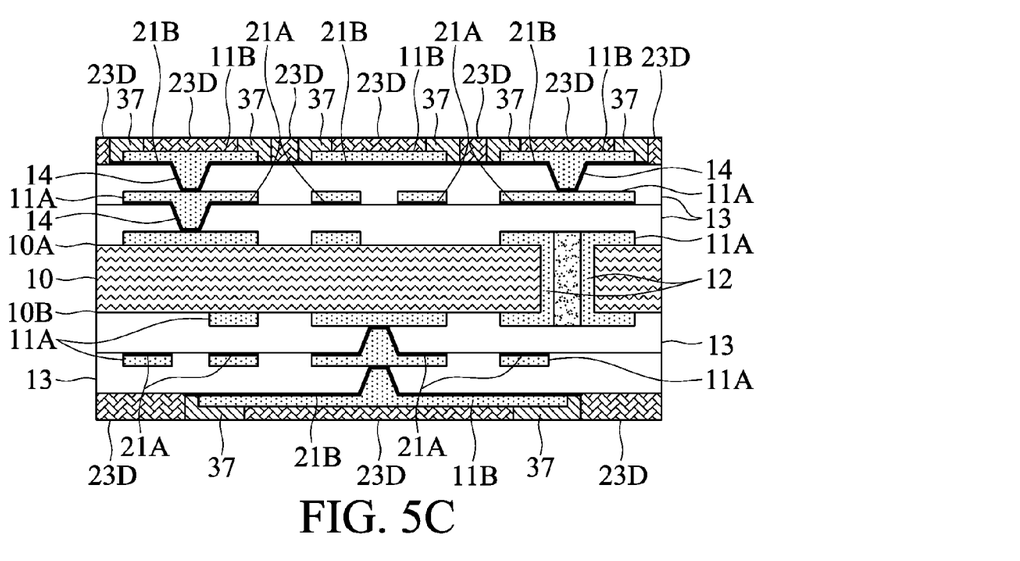
Figure 5D:
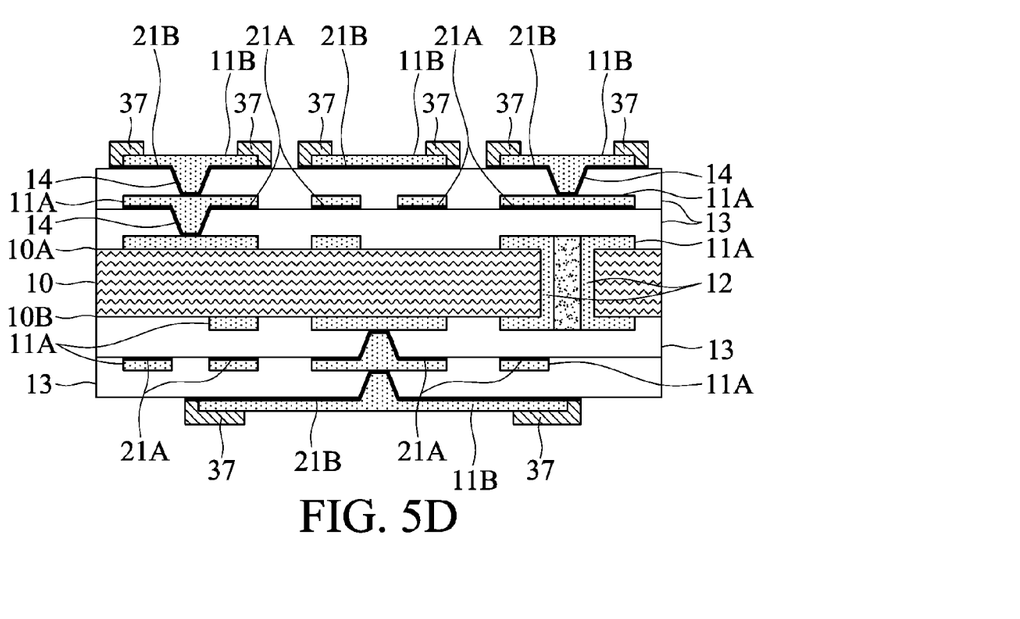
Figure 5E:
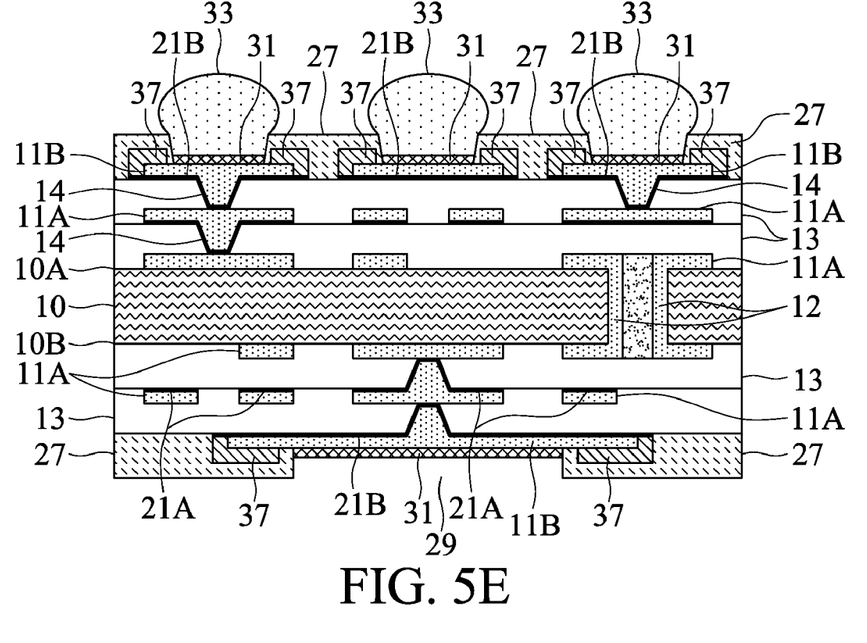

In one embodiment, after forming the bonding pad 11B as shown in FIG. 2G, the photoresist layer 23B is removed as shown in FIG. 5A. Subsequently, the patterned photoresist layer 23D is formed as shown in FIG. 5B. Thereafter, the ring-shaped anti-etching layer 37 is formed by the described SAP process as shown in FIG. 5C. At last, the patterned photoresist layer 23D is removed and the exposed seed layer 21B is then removed as shown in FIG. 5D. Compared to the ring-shaped anti-etching layer 25 in FIG. 2J, the ring-shaped anti-etching layer 37 in FIG. 5D further protects the sidewall of the bonding pad 11B. Moreover, the size of the ring-shaped anti-etching layer 37 can be tuned according to requirements. After the removal of the patterned photoresist layer 23D and underlying seed layer 21B, subsequent processes to form the anti-soldering insulation layer 27, the opening 29, the metal protection layer 31, and the solder ball 33 are performed and similar to that of FIGS. 2K-2N. The resulting structure is shown as FIG. 5E.

Figure 6A:
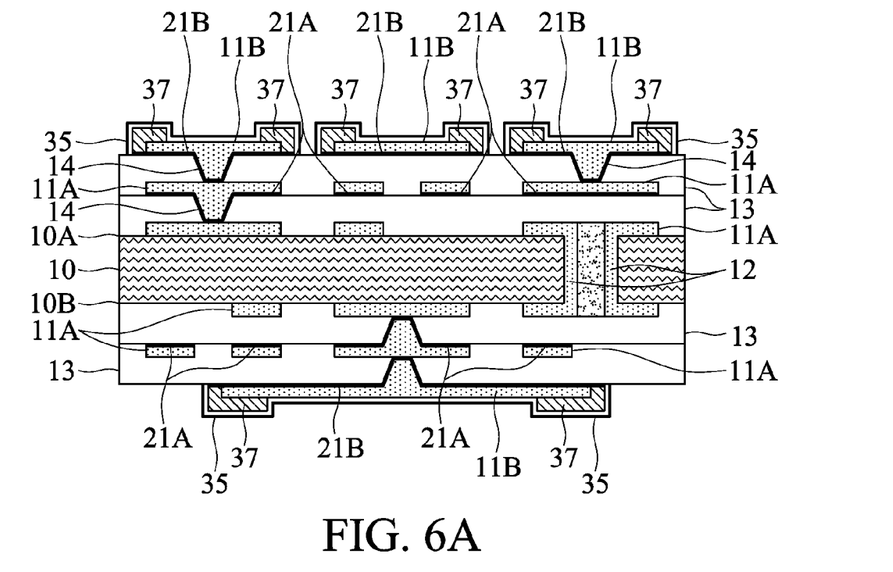
FIGS. 6A-6B are serial cross sections showing the process for forming a printed circuit board structure in one embodiment of the invention.
Figure 6B:
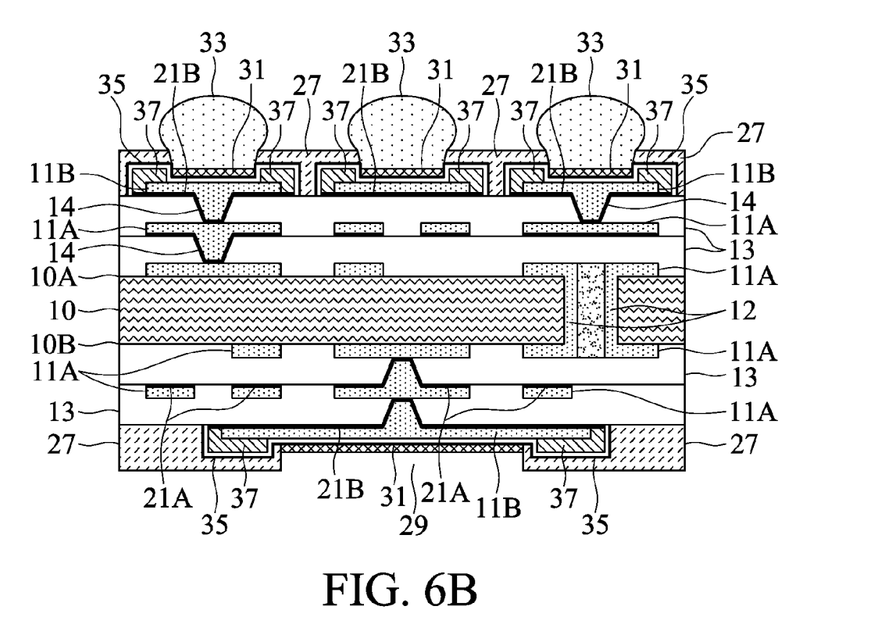

In one embodiment, an anti-etching metal layer 35 is further formed on the top surface of the bonding pad 11B and on the top surface and the sidewall of the ring-shaped anti-etching layer 37 as shown in FIG. 6A. The anti-etching metal layer 35 is formed after the removal of the patterned photoresist layer 23D as shown in FIG. 5D, and before the formation of the anti-soldering layer 27 (please refer to FIG. 2K). The formation of the anti-etching metal layer 35 is similar to the surface treatment (ASF) process, and the material thereof can be nickel, tin, palladium, gold, aluminum, tungsten, chromium, and the likes. The anti-etching metal layer is utilized to further enforce the described structure. Because the inter region between the ring-shaped anti-etching layer 37 and the bonding pad 11B still possibly etched during the processes, the anti-etching metal layer 35 is added to avoid the inter region between the thinner ring-shaped anti-etching layer 37 and the bonding pad 11B from etching. After the formation of the anti-etching metal layer 35, the following processes to from the anti-soldering insulation layer 27, the opening 29, the metal protection layer 31, and the solder ball 33 are similar to that of FIGS. 2K-2N, and the resulting structure is shown as FIG. 6B.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A printed circuit board structure, comprising:
   a core board;
   an inner circuit on the surface of the core board;
   a bonding pad on the inner circuit;
   a ring-shaped anti-etching layer on the outer-ring of the bonding pad; and
   an anti-soldering insulation layer on the ring-shaped anti-etching layer and the bonding pad,
   wherein the anti-soldering insulation layer has an opening to expose a part of the bonding pad, and
   wherein the opening has a shorter radius than the ring-shaped anti-etching layer, and the bonding pad surface is free of concave, and
   wherein an inner sidewall of the ring-shaped anti-etching layer is covered by the anti-soldering insulation layer and not exposed by the opening.

2. The printed circuit board structure as claimed in claim 1, further comprising a solder ball in the opening.

3. The printed circuit board structure as claimed in claim 2, further comprising a metal protection layer between the solder ball and the bonding pad.

4. The printed circuit board structure as claimed in claim 1, wherein the anti-soldering insulation layer is thicker than the ring-shaped anti-etching layer, and the anti-soldering insulation layer totally covers the ring-shaped anti-etching layer.

5. The printed circuit board structure as claimed in claim 1, further comprising an anti-etching metal layer on a top surface and the inner sidewall of the ring-shaped anti-etching layer and a top surface of the bonding pad.

6. The printed circuit board structure as claimed in claim 1, wherein the ring-shaped anti-etching layer covers the sidewall of the outer-ring part of the bonding pad.

7. The printed circuit board structure as claimed in claim 6, further comprising an anti-etching metal layer on a top surface and the inner side wall of the ring-shaped anti-etching layer and on a top surface of the bonding pad.

\* \* \* \* \*